United States Patent
Yonehara et al.

(10) Patent No.: US 7,015,507 B2
(45) Date of Patent: Mar. 21, 2006

(54) THIN FILM TRANSISTOR AND METHOD OF FABRICATING THE SAME

(75) Inventors: Takao Yonehara, Kanagawa (JP); Tetsuya Shimada, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 19 days.

(21) Appl. No.: 10/855,370

(22) Filed: May 28, 2004

(65) Prior Publication Data

US 2004/0251462 A1    Dec. 16, 2004

(30) Foreign Application Priority Data

Jun. 12, 2003   (JP)   ............... 2003-167800

(51) Int. Cl.
H01L 29/04   (2006.01)
(52) U.S. Cl. .................. 257/65; 257/52; 257/55; 257/59; 257/63; 257/64; 257/66
(58) Field of Classification Search .......... None
See application file for complete search history.

(56) References Cited

U.S. PATENT DOCUMENTS

| | | | |
|---|---|---|---|
| 5,371,037 A | 12/1994 | Yonehara | 437/86 |
| 5,371,380 A * | 12/1994 | Saito et al. | 257/52 |
| 5,591,988 A * | 1/1997 | Arai et al. | 257/59 |
| 5,712,199 A | 1/1998 | Nakagawa et al. | 438/62 |
| 5,970,361 A | 10/1999 | Kumomi et al. | 438/409 |
| 6,106,613 A | 8/2000 | Sato et al. | 117/54 |
| 6,140,209 A | 10/2000 | Iwane et al. | 438/458 |
| 6,143,628 A | 11/2000 | Sato et al. | 438/455 |
| 6,156,624 A | 12/2000 | Yamagata et al. | 438/459 |
| 6,190,937 B1 | 2/2001 | Nakagawa et al. | 438/67 |
| 6,211,038 B1 | 4/2001 | Nakagawa et al. | 438/409 |
| 6,258,698 B1 | 7/2001 | Iwasaki et al. | 438/455 |
| 6,306,729 B1 | 10/2001 | Sakaguchi et al. | 438/458 |
| 6,331,208 B1 | 12/2001 | Nishida et al. | 117/89 |
| 6,382,292 B1 | 5/2002 | Ohmi et al. | 156/584 |
| 6,391,743 B1 | 5/2002 | Iwane et al. | 438/458 |
| 6,429,095 B1 | 8/2002 | Sakaguchi et al. | 438/458 |
| 6,452,091 B1 | 9/2002 | Nakagawa et al. | 136/261 |
| 6,475,323 B1 | 11/2002 | Ohmi et al. | 156/239 |
| 6,537,862 B1 * | 3/2003 | Song | 438/157 |

(Continued)

FOREIGN PATENT DOCUMENTS

JP    02038570 A  *  2/1990

(Continued)

OTHER PUBLICATIONS

Tizabi, Djamshid, et al. "Toward Wall Panel TV," *Optoelectronics- Device and Technologies*, vol. 1, No. 1, Jun. 1986. Pp. 85-96.

*Primary Examiner*—Andy Huynh
(74) *Attorney, Agent, or Firm*—Fitzpatrick, Cella, Harper & Scinto

(57) ABSTRACT

Provided is a non-single-crystal germanium thin film transistor having a gate insulating film capable of reducing the interface state density between an active layer and the gate insulating film. This thin film transistor has an active layer made of a non-single-crystal germanium film, and a gate oxide film substantially made of zirconium oxide or hafnium oxide.

4 Claims, 4 Drawing Sheets

U.S. PATENT DOCUMENTS

| | | | |
|---|---|---|---|
| 6,566,235 B1 | 5/2003 | Nishida et al. | 438/458 |
| 6,613,678 B1 | 9/2003 | Sakaguchi et al. | 438/695 |
| 6,639,327 B1 | 10/2003 | Momoi et al. | 257/913 |
| 6,674,167 B1 * | 1/2004 | Ahn et al. | 257/750 |
| 6,677,183 B1 | 1/2004 | Sakaguchi et al. | 438/113 |
| 6,756,289 B1 | 6/2004 | Nakagawa et al. | 438/478 |
| 6,787,433 B1 * | 9/2004 | Mitani et al. | 438/479 |
| 2002/0100941 A1 | 8/2002 | Yonehara et al. | 257/359 |
| 2002/0102758 A1 | 8/2002 | Yonehara et al. | 438/30 |

FOREIGN PATENT DOCUMENTS

| | | |
|---|---|---|
| JP | 2855300 | 11/1998 |

* cited by examiner

THIN FILM TRANSISTOR AND METHOD OF FABRICATING THE SAME

FIELD OF THE INVENTION

The present invention relates to a TFT (Thin Film Transistor) having a non-single-crystal germanium film as an active layer, and a method of fabricating the same.

BACKGROUND OF THE INVENTION

A thin film transistor having a non-single-crystal germanium film as an active layer (this transistor will be referred to as a non-single-crystal germanium TFT hereinafter) has high mobility and high drivability, and is superior in these characteristics to a thin film transistor having a non-single-crystal silicon film as an active layer (this transistor will be referred to as a non-single-crystal silicon TFT hereinafter). Also, the non-single-crystal germanium TFT can be fabricated at a lower temperature than that for the non-single-crystal silicon TFT. Therefore, it is expected to widen the range of selection of substrates, and realize larger areas and more flexible substrates. For example, thin film transistors having a non-single-crystal germanium film as an active layer are proposed in references 1 and 2.

As described above, the non-single-crystal germanium TFT is superior in many characteristics to the non-single-crystal silicon TFT. However, no non-single-crystal germanium TFT has been put into practical use.

Note that reference 1 discloses a thin film transistor having an oxide film containing aluminum oxide and silicon oxide as a gate insulating layer. Note also that reference 2 does not disclose any practical materials of a gate insulating film.

Reference 1: OPTOELECTRONICS—Device and Technologies, Vol. 1, No. 1, pp. 85–96, Jun., 1986, "TOWARD WALL PANEL TV", Djamshid Tizabi and Albert George Fischer Reference 2: Japanese Patent No. 2,855,300

To well achieve the superior characteristics of the non-single-crystal germanium TFT and put it into practical use, it is necessary to reduce the interface state density between an active layer made of non-single-crystal germanium and a gate insulating film. If this interface state density is high, a threshold value variation, leakage current, or the like of the TFT worsens.

SUMMARY OF THE INVENTION

The present invention has been made in consideration of the above situation, and has as its object to provide a non-single-crystal germanium TFT having a gate insulating film capable of reducing the interface stage density between an active layer and the gate insulating film, and a method of fabricating the same, in order to well achieve the superior characteristics of the non-single-crystal germanium TFT.

A thin film transistor formed on a substrate according to the first aspect of the present invention comprises an active layer made of non-single-crystal germanium, and a gate oxide film substantially made of zirconium oxide or hafnium oxide.

A fabrication method of forming a thin film transistor on a substrate according to the second aspect of the present invention comprises a step of forming a non-single-crystal germanium film, and an oxidation step of forming an oxide film substantially made of zirconium oxide or hafnium oxide.

In a preferred embodiment of the present invention, an oxide film substantially made of zirconium oxide or hafnium oxide is preferably formed on a non-single-crystal germanium film.

In another preferred embodiment of the present invention, a non-single-crystal germanium film is preferably formed on an oxide film substantially made of zirconium oxide or hafnium oxide.

In still another preferred embodiment of the present invention, zirconium oxide or hafnium oxide is preferably formed by oxidizing a metal film which is formed on a non-single-crystal germanium film or substrate and made of zirconium or hafnium. Alternatively, zirconium oxide or hafnium oxide is preferably formed by exposing a metal film made of zirconium or hafnium to an ambient containing oxygen or ozone.

In the present invention, the use of zirconium oxide or hafnium oxide as a gate insulating film makes it possible to reduce the interface state density between an active layer made of non-single-crystal germanium and the gate insulating film, so a threshold value variation, leakage current, or the like of a TFT can be suppressed. Accordingly, the superior characteristics of a non-single-crystal germanium TFT can be achieved.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

[First Embodiment]

A thin film transistor and a method of fabricating the same according to the first embodiment of the present invention will be described below with reference to FIGS. 1 and 2.

Figure 1:
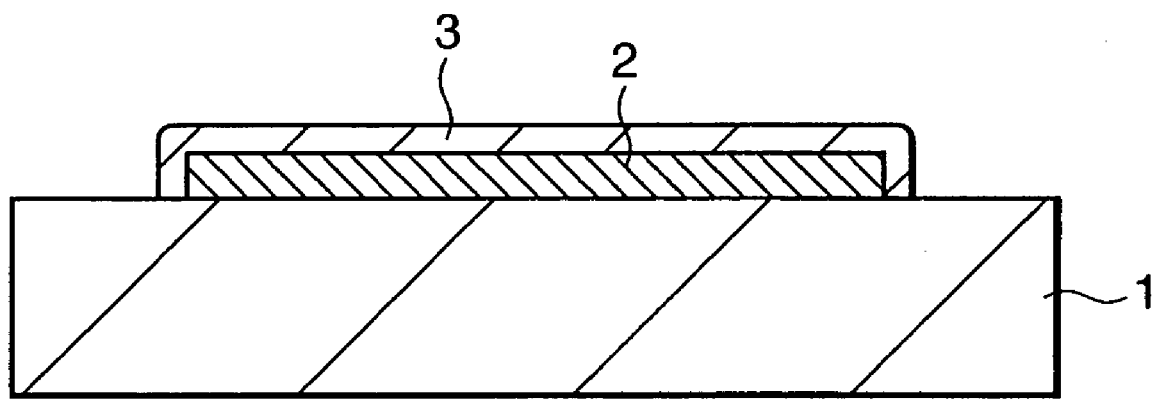
FIG. 1 is a sectional view showing a method of fabricating a thin film transistor according to the first embodiment of the present invention.

As shown in FIG. 1, a non-single-crystal germanium film 2 is formed on a substrate 1 to form a TFT active layer. On the non-single-crystal germanium film 2, an oxide film 3 substantially made of zirconium oxide or hafnium oxide is formed to form a gate oxide film.

Figure 2:
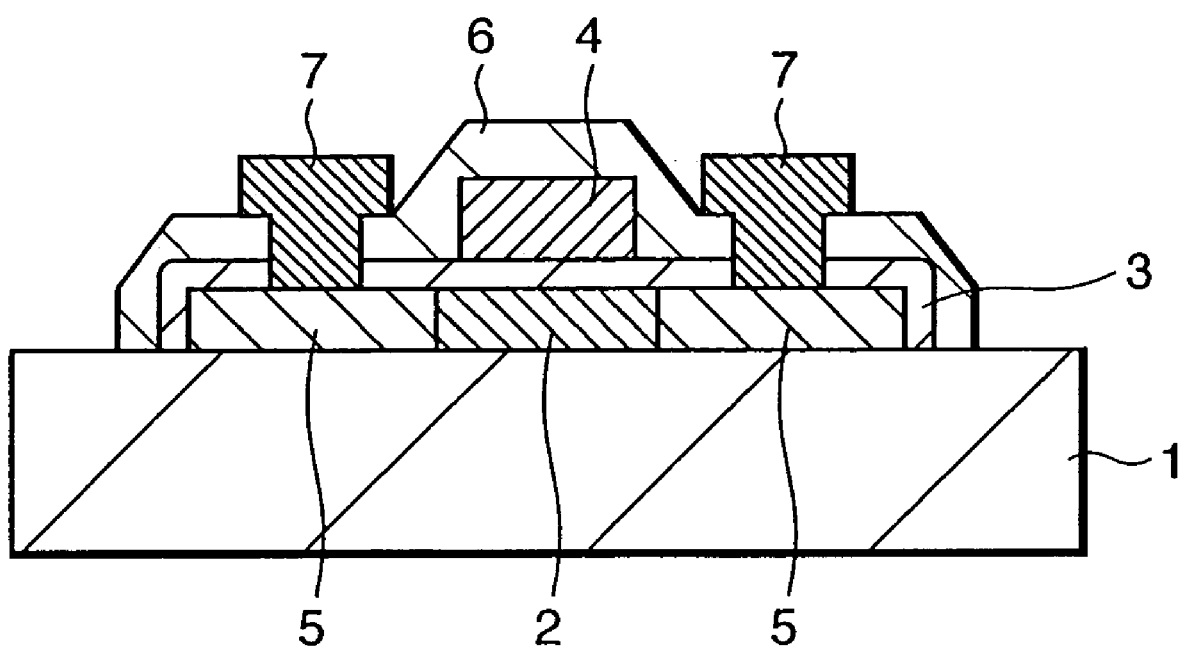
FIG. 2 is a sectional view showing an outline of the structure of the thin film transistor and the method of fabricating the same according to the first embodiment of the present invention.

As shown in FIG. 2, a gate electrode 4 is formed on the oxide film 3 to form a planar TFT having the non-single-crystal germanium active layer 2 and the gate oxide film 3 substantially made of zirconium oxide or hafnium oxide. Reference numerals 5 denote source and drain regions defined in the active layer 2; 6, a protective film; and 7, source and drain electrodes.

[Second Embodiment]

A thin film transistor and a method of fabricating the same according to the second embodiment of the present invention will be described below with reference to FIGS. 3 and 4.

Figure 3:
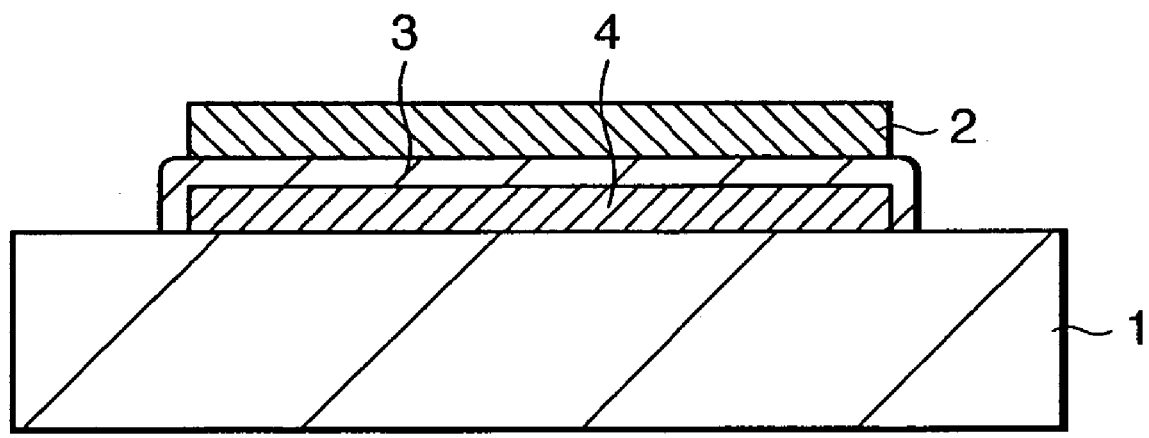
FIG. 3 is a sectional view showing a method of fabricating a thin film transistor according to the second embodiment of the present invention.

As shown in FIG. 3, a gate electrode 4 is formed on a substrate 1, and an oxide film 3 substantially made of zirconium oxide or hafnium oxide is formed on the gate electrode 4. Then, an active layer 2 made of a non-single-crystal germanium film is formed.

Figure 4:
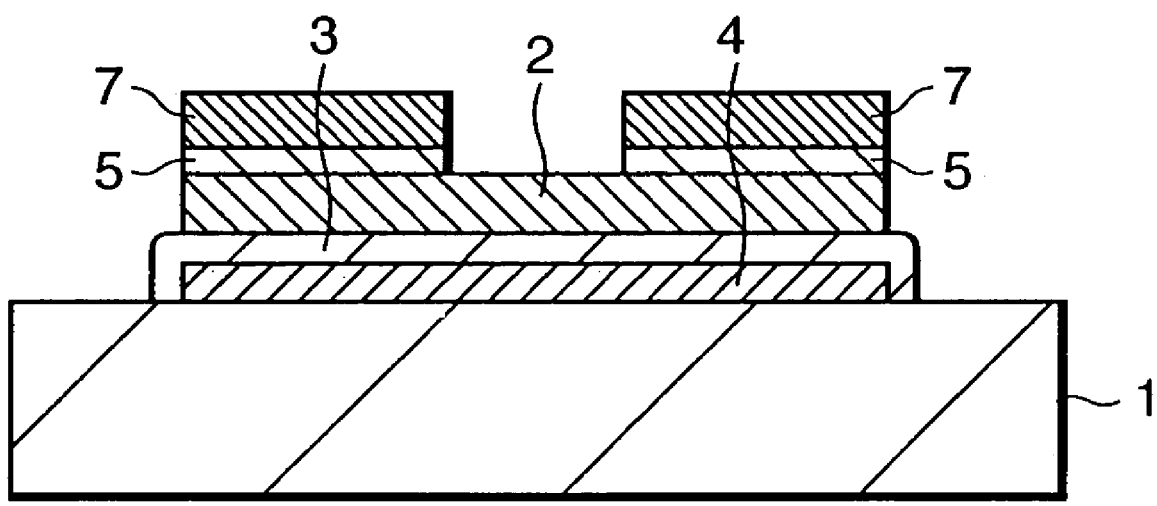
FIG. 4 is a sectional view showing an outline of the structure of the thin film transistor and the method of fabricating the same according to the second embodiment of the present invention.

As shown in FIG. 4, source and drain regions 5 are formed in the active layer 2 to form a staggered TFT having the non-single-crystal germanium active layer 2 and the gate oxide film 3 substantially made of zirconium oxide or hafnium oxide. Reference numerals 7 denote source and drain electrodes.

Examples of a substrate preferably usable in the present invention are glass and polyimide.

Also, examples of non-single-crystal germanium preferably usable in the present invention are amorphous germanium, polycrystalline germanium, and microcrystalline germanium.

In the present invention, preferred examples of a non-single-crystal germanium film formation method are CVD, vacuum evaporation, and sputtering. It is also possible to crystalize a non-single-crystal germanium film by performing annealing in an ambient containing a metal catalyst such as copper.

In the present invention, preferred examples of a zirconium oxide film formation method are CVD, vacuum evaporation, and sputtering. A zirconium oxide film can also be formed by depositing a zirconium film by sputtering or the like, and oxidizing the zirconium film by exposing it to an ambient containing oxygen or ozone.

In the present invention, preferred examples of a hafnium oxide film formation method are CVD, vacuum evaporation, and sputtering. A hafnium oxide film can also be formed by depositing a hafnium film by sputtering or the like, and oxidizing the hafnium film by exposing it to an ambient containing oxygen or ozone.

In the present invention, the use of zirconium oxide or hafnium oxide as a gate insulating film makes it possible to reduce the interface state density between an active layer made of non-single-crystal germanium and the gate insulating film, so a threshold value variation, leakage current, or the like of a TFT can be suppressed. Accordingly, it is possible to realize a higher speed, larger area, and more flexible substrate than those of a non-single-crystal silicon TFT.

As many apparently widely different embodiments of the present invention can be made without departing from the spirit and scope thereof, it is to be understood that the invention is not limited to the specific embodiments thereof except as defined in the appended claims.

What is claimed is:

1. A thin film transistor formed on a substrate, comprising:
   an active layer located on the substrate and made of non-single-crystal germanium; and
   a gate oxide film located on the active layer and substantially made of an oxide selected from the group consisting of zirconium oxide and hafnium oxide.

2. A fabrication method of forming a thin film transistor on a substrate, comprising steps of:
   forming a non-single-crystal germanium film on the substrate; and
   forming an oxide film substantially made of an oxide selected from the group consisting of zirconium oxide and hafnium oxide on the non-single-crystal germanium film.

3. The method according to claim 2, wherein the oxide film is formed by oxidizing a metal film substantially made of a metal selected from the group consisting of zirconium and hafnium.

4. The method according to claim 3, wherein the oxide film is formed by exposing the metal film to an ambient containing a material selected from the group consisting of oxygen and ozone.

* * * * *